(12) United States Patent
Sporon-Fiedler et al.

(10) Patent No.: US 8,797,756 B2
(45) Date of Patent: Aug. 5, 2014

(54) INTEGRATED OVERMOLDED INTERCONNECT TAB FOR SURFACE-MOUNTED CIRCUITS

(75) Inventors: Frederik Sporon-Fiedler, Corvallis, OR (US); Eric Austin, Portland, OR (US); Barry Haskins, Woodburn, OR (US)

(73) Assignee: Biotronik SE & Co. KG, Berlin (DE)

( * ) Notice: Subject to any disclaimer, the term of this patent is extended or adjusted under 35 U.S.C. 154(b) by 258 days.

(21) Appl. No.: 13/198,646

(22) Filed: Aug. 4, 2011

(65) Prior Publication Data
US 2012/0069536 A1 Mar. 22, 2012

Related U.S. Application Data

(60) Provisional application No. 61/384,750, filed on Sep. 21, 2010.

(51) Int. Cl.
*H05K 7/10* (2006.01)
(52) U.S. Cl.
USPC .......................... 361/767; 361/752; 361/760
(58) Field of Classification Search
USPC .................. 361/767, 760, 752, 736, 748
See application file for complete search history.

(56) References Cited

U.S. PATENT DOCUMENTS

| 6,445,592 | B1 | 9/2002 | Schirmer | |
|---|---|---|---|---|
| 8,011,950 | B2 * | 9/2011 | McGrath et al. | 439/497 |
| 8,053,679 | B2 * | 11/2011 | Fan | 174/261 |
| 2004/0032018 | A1 * | 2/2004 | Morinaga et al. | 257/686 |
| 2005/0163915 | A1 * | 7/2005 | Baumann | 427/5 |
| 2006/0134985 | A1 * | 6/2006 | Reed et al. | 439/607 |
| 2007/0252556 | A1 * | 11/2007 | West et al. | 320/116 |
| 2009/0093136 | A1 | 4/2009 | Hiew et al. | |
| 2010/0183457 | A1 * | 7/2010 | Hattori et al. | 417/410.1 |

FOREIGN PATENT DOCUMENTS

| EP | 0650315 A2 | 4/1995 |
|---|---|---|
| JP | 2002321247 A | 11/2002 |

OTHER PUBLICATIONS

European Search Report received fro EP Application U.S. Appl. No. 11/179,127, dated Dec. 12, 2012, 5 pages.

* cited by examiner

*Primary Examiner* — Andargie M Aychillhum
(74) *Attorney, Agent, or Firm* — ARC IP Law, PC; Joseph J. Mayo

(57) ABSTRACT

An integrated interconnect tab that provides a mechanically repeatable connection point to electrical components mounted on a printed circuit board. The integrated interconnect tab comprises a conductive pad surrounded by a vertical sidewall structure formed in an overmolded insulating layer. In one embodiment, a large pad accommodates connections to high-power circuit elements such as batteries and high-voltage capacitors. The sidewall structure helps align and guide the position of an interconnecting device such as a wire ribbon connector, facilitating automation of a subsequent attachment process. An automated method of making a PCB assembly having integrated interconnect tabs entails attaching circuit elements and interconnect tabs to a surface of a PCB substrate, encapsulating the attached components, and selectively machining the encapsulating layer to expose weld tabs, to form the vertical sidewall structure surrounding the tabs, and to create mechanical retention features to aid in welding.

12 Claims, 6 Drawing Sheets

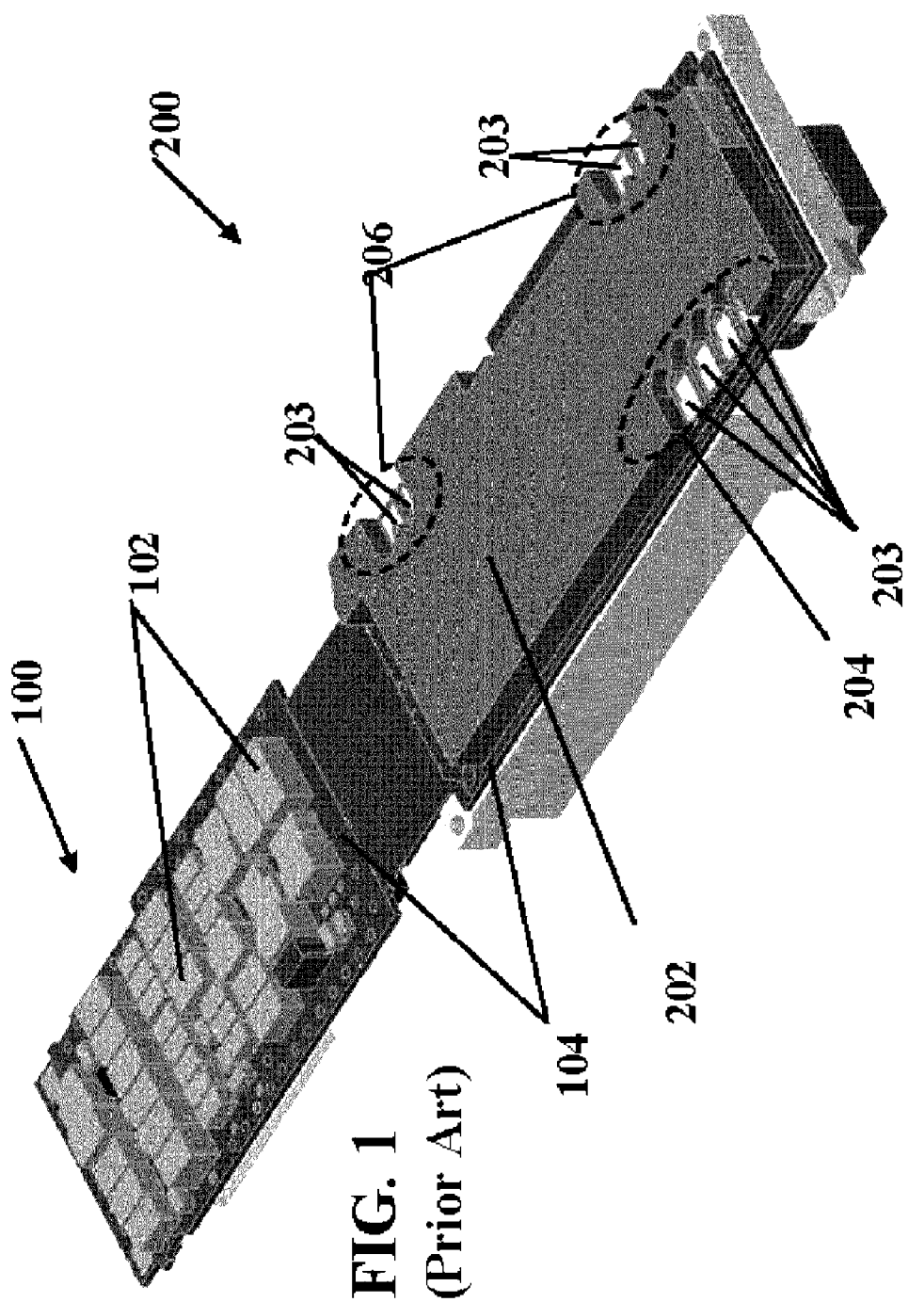

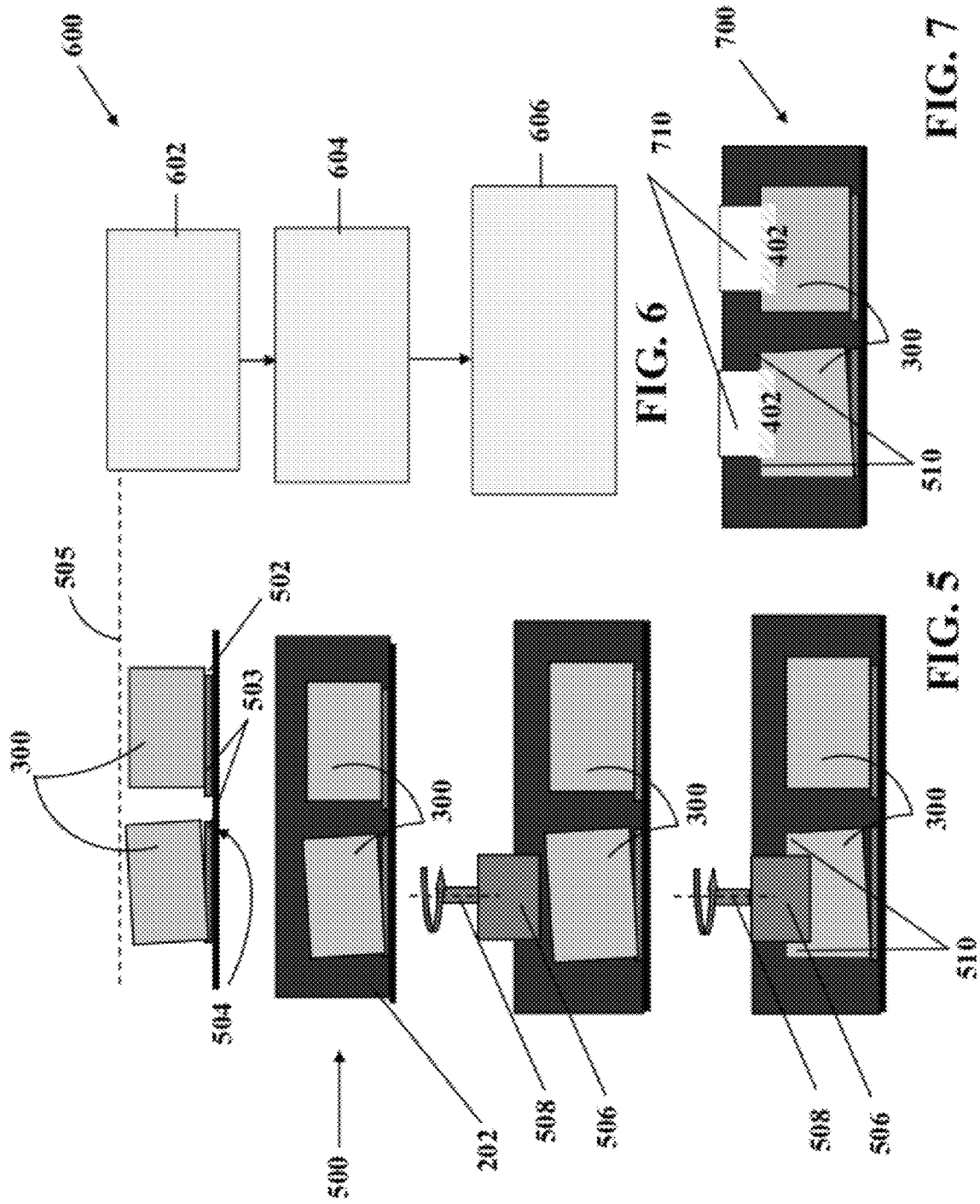

US 8,797,756 B2

INTEGRATED OVERMOLDED INTERCONNECT TAB FOR SURFACE-MOUNTED CIRCUITS

This patent application claims the benefit of U.S. Provisional Patent Application No. 61/384,750, filed on Sep. 21, 2010, which is hereby incorporated herein by reference.

BACKGROUND OF THE INVENTION

Field of the Invention

Surface-mount technology (SMT) is used to construct printed circuit boards (PCBs) in which electronic chips, modules, or discrete components are mounted directly to a common substrate. At least one layer of electrical wiring is either printed on, or embedded inside, the substrate. Direct attachment of SMT components is typically accomplished by patterning contact pads on a surface of the substrate, aligning with the contact pads a grid of pins or solder balls distributed on the underside of each component in a ball grid array (BGA), and then forming a bond.

Prior to development of SMT methods, PCBs were constructed using through-hole technology (THT) by printing wires on the surface of the substrate, drilling holes through the board, and attaching electronic components to the board using leads that pass through the holes and are secured on the back side of the board. THT has the advantage of a stronger mechanical connection than solder provides.

Surface mount technology provides many advantages compared to through-hole technology. For example, because peripheral leads are not required for each component, the overall component footprint on the surface is reduced. In addition, parasitic resistance and radio frequency (RF) interference associated with the leads are eliminated. Because layers of wiring may be effectively embedded by stacking and laminating multiple PCBs, SMT is inherently three-dimensional, instead of two-dimensional. Because the interconnect structure is no longer limited to a two-dimensional area, and because drilling through-holes is not required, components may be direct-mounted on both surfaces of the board. Furthermore, SMT assembly is faster and more easily automated. Some SMTs are flexible and may be bent or folded to conform to enclosures of various geometries. These "flex circuits" can be manufactured in single-sided flex, double-sided flex, multilayer flex, and rigid flex configurations.

Finished PCBs of either the through-hole or surface mount varieties may be encapsulated with a protective coating of one or more layers of epoxy, silicone, polyurethane, or other similar material, to guard against environmental degradation due to moisture, extreme temperatures, and the like. The encapsulation layer may be formed either by depositing a single material, or by laminating multiple protective layers. Methods of encapsulation include dam/fill encapsulation and transfer molding encapsulation, both of which are well known to persons of skill in the art.

SMT-mounted circuits may be connected to higher-power components such as batteries and high-voltage capacitors by providing large interconnect terminals, or "welding tabs," on a surface of an SMT substrate. The welding tabs provide robust connection points, for securing interconnect devices such as weld straps, wire ribbon connectors, individual wires, or electronic components directly, during a subsequent laser welding step. One application that requires robust electrical coupling is in implantable medical devices that are designed to deliver high-voltage electrical signals, such as, for example, implantable cardiac defibrillators. The process of surface mounting individual weld tabs may be susceptible to tip, tilt, or lateral movement, causing misalignment that may result in a weak electrical connection or an open circuit. An alternative process, such as that described in U.S. Pat. No. 6,963,780 to Ruben et al., entails embedding a terminal array in a plastic matrix within a separate housing and then surface mounting the housing onto the substrate. Such a process has proven to be cost-effective, but it is an ineffective solution to the misalignment problem because the plastic matrix itself remains prone to lateral movement. Misalignment of terminals used for electrical coupling via laser welding generally precludes the use of automated laser welding equipment that could otherwise reduce cost and improve repeatability of the welding process.

BRIEF SUMMARY OF THE INVENTION

An integrated interconnect tab provides a mechanically repeatable connection point for electrical components mounted on a printed circuit board, enabling automation of the board assembly process. Such an interconnect tab comprises an oversized electrically conductive, substantially flat pad and a substantially vertical sidewall structure formed in a preferably conformal, overmolded insulating layer that covers the electrical components and surrounds the conductive pad. In a preferred embodiment, the pad is large, of comparable size to electronic components that are surface-mounted onto the PCB, so that the pad may accommodate connections to external high-power circuit elements such as batteries and high-voltage capacitors. A sidewall structure helps guide the position of an interconnecting device such as a wire, a wire ribbon connector comprising an array of wires, or an electronic component while it is being positioned on the pad. In addition, the sidewall profile may be fashioned so as to provide a retention feature for securely retaining the connector.

An automated method of manufacturing a PCB assembly having integrated interconnect tabs entails attaching circuit elements and interconnect tabs to a surface of a PCB substrate, encapsulating the attached components, machining the encapsulating layer to expose the interconnect tabs and form sidewall structures, and welding to the interconnect tabs, using the sidewalls to align and guide the interconnect device. Although this method of manufacture does not prevent misalignment of weld tabs per se, the surface of the weld tabs is planarized during the machining step so that the process is able to tolerate some degree of misalignment, thus enabling the subsequent welding step to be automated, in spite of tab misalignment.

BRIEF DESCRIPTION OF THE DRAWINGS

FIG. 1 is a perspective view of a prior art, unencapsulated, flexible surface-mount printed circuit board.

FIG. 2 is a perspective view of an encapsulated surface-mount printed circuit board, according to a preferred embodiment, showing a linear array of four integrated overmolded interconnect tabs and two pairs of integrated overmolded interconnect tabs within dashed ovals.

FIG. 5 is a series of cross-sectional diagrams at each step in a preferred process of forming the integrated interconnect tabs shown in FIGS. 2-4.

FIG. 6 is a flow diagram that presents a sequence of steps describing a preferred process of fabricating an integrated overmolded interconnect tab, wherein each panel in the flow diagram corresponds to a cross-sectional diagram shown in FIG. 5.

FIG. 7 is a final side view of adjacent interconnect tabs after completion of the process steps shown in FIGS. 5 and 6.

DETAILED DESCRIPTION OF THE INVENTION

Figure 3:
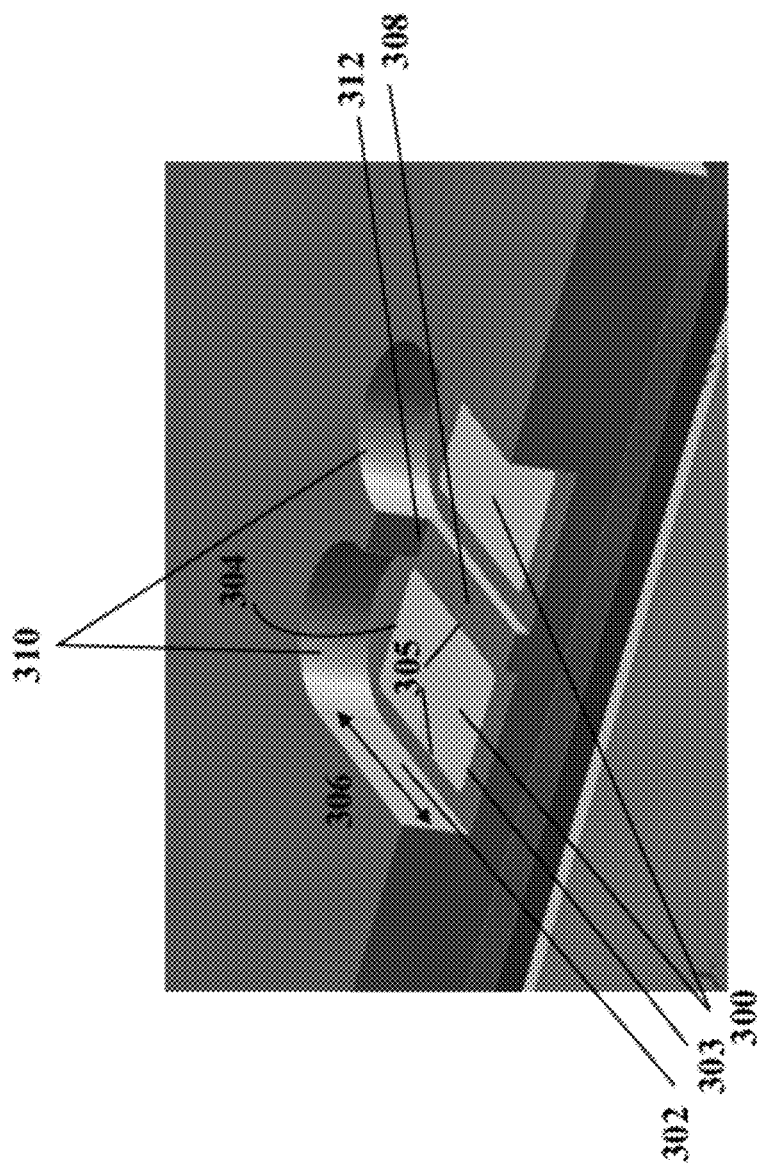
FIG. 3 is a magnified perspective view of a pair of integrated overmolded interconnect tabs, according to an embodiment in which the interconnect tabs are rectangular and sidewalls of the overmolding are curved opposite the edge of the PCB.

Embodiments of the invention will be readily understood from the following detailed description in conjunction with the accompanying drawings. To facilitate this description, like reference numerals designate like structural elements. Embodiments of the invention are illustrated by way of example and not by way of limitation in the figures of the accompanying drawings.

A structural description corresponds to FIGS. 1-4, followed by a procedural description of methods used to create those structures, as illustrated in FIGS. 5-9. FIG. 1 shows a prior art unencapsulated SMT PCB assembly 100 having many exposed electronic components 102, of which two examples are indicated. Electronic components 102 are surface-mounted to a substrate 104. Substrate 104 may be flexible or semi-flexible ("rigidized") type of circuit board used to build foldable circuits. Typically, a flexible substrate 104 includes a core formed by laminating layers of copper, polyimide, and adhesives to form an interconnect structure. One or more layers of substrate 104 may be plated with a conducting layer or an alloy of conductors, such as gold or nickel. Alternatively, substrate 104 may be a rigid type of circuit board, such as, for example, industry standard G10/FR4 composite, which combines glass fibers and epoxy resin. A standard manufacturing process, as would be used to make the PCB shown in FIG. 1, typically does not combine machining operations with the electronics assembly process. Machining and molding of each of electronic components 102 is usually completed first, and then components 102 are assembled onto the PCB. While such standard methods are relatively inexpensive, they may not yield optimal electrical and mechanical characteristics.

FIG. 2 shows an encapsulated SMT PCB 200 wherein surface-mounted electronic components 102 are not visible because they are covered by an integrated, overmolded encapsulating layer 202. Outer edges of substrate 104 remain exposed. Examples of multiples of a large, integrated interconnect tab 203 may be arranged as a linear array of tabs 204 or as pairs of tabs 206. These arrangements (as shown in FIG. 2, outlined in dashed ovals) are located along the edges of PCB 200, outside encapsulating layer 202, thus exposing interconnect tabs 203 for connection to external devices, in particular, high power devices. As shown in a preferred embodiment in FIG. 2, linear array of tabs 204 comprises four integrated interconnect tabs 203, suitable for connecting to a bank of high voltage capacitors, for example, and each pair of interconnect tabs 206 comprises two tabs 203, each tab 203 being suitable for connecting to, for example, an energy dissipation ("dump") resistor or a battery.

With reference to FIG. 3, an embodiment of the structure of a pair of interconnect tabs 206 is shown in greater detail. Each individual interconnect tab 203 comprises a substantially planar electrically conductive pad 300 covering an area approximately comparable to the size of a typical surface-mounted electronic component 202. Conductive pads 300 may be surrounded, at least partly, by a vertical sidewall 302 formed by selective removal of insulating encapsulating layer 202. The surface area of conductive pad 300 is shown as rectangular, though in general, conductive pad 300 may take any shape, for example, circular. The dimension of each conductive pad 300 may be within the range of 0.25 mm-5.0 mm. Each one of the exemplary rectangular conductive pads 300 as shown includes an outside edge 303, an inside edge 304, and parallel side edges 305 comprising the perimeter of conductive pad 300. A straight vertical sidewall portion 306 of encapsulating layer 202 is aligned substantially parallel to the outside edges 303 of pads 300. A curved vertical sidewall portion 310 of encapsulating layer 202 arches away from inside edge 304 of each rectangular conductive pad 300 so as to form a surround capable of containing and guiding a connecting device toward making contact with pad 300 during a subsequent attach process. Curved sidewall portion 310 may be created with a rotating cutting tool used to facilitate fabrication using conventional machining methods.

Figure 4:
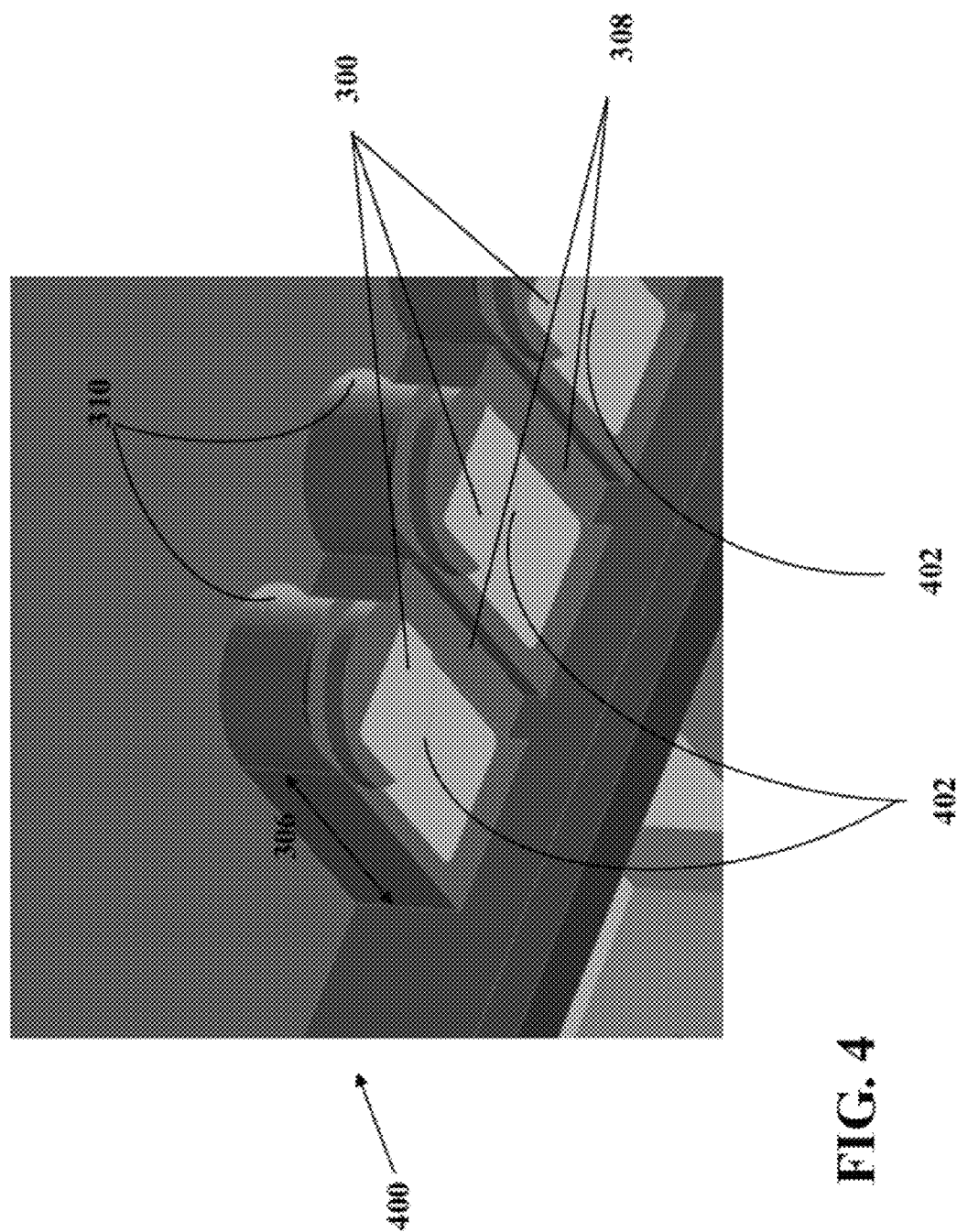
FIG. 4 is a magnified perspective view of an array of integrated overmolded interconnect tabs, according to an embodiment in which the interconnect tabs are rectangular and a circular recessed area overlaps each pad shown in FIG. 3.

When interconnect tabs 203 are arranged in pairs of tabs 206 or in linear arrays of tabs 204 as shown in FIGS. 3 and 4, each common vertical sidewall 302 separating pairs of adjacent tabs 206 is vertically shortened to form a dividing pedestal 308. Dividing pedestal 308 extends from an edge of PCB 200, along side edge 305, toward a divider termination point 312 located beyond inside edge 304, but not as far as vertical sidewall portion 310, so as to ensure that the profile of vertical sidewall portion 310 remains curved, and that a volume of space surrounding each pad area remains separate and distinct so as to provide sufficient structural support for a connecting device to be effectively guided toward making contact with pad 300. In this way, the structure of integrated interconnect tabs 203 may assist in automating the subsequent attach process.

Integrated interconnect tabs 203 thus formed, compared with prior art structures found on unencapsulated PCBs 100, present welding surfaces that offer improved electrical isolation because they are surrounded by a plastic insulating material. The primary purpose of dividing pedestal 308 is for improved electrical isolation between adjacent pads configured in pairs or arrays. Multiple different routing bits, rotation speeds, and variations in the routing step may be employed to shape dividing pedestal 308 and a generally vertical sidewall extending downward to divider termination point 312 as shown in FIG. 3.

Because they are volumetrically oversized, interconnect tabs 203 also serve as efficient heat sinks, while minimizing excess heat transferred into substrate attachment materials that may be sandwiched between pads 300 and substrate 104. Furthermore, integrated interconnect tabs 203 present locations and surfaces that are structurally similar and allow mechanically repeatable access to conductive pads 300, thus facilitating the use of automated interconnect tools for subsequent processing.

A circular recessed area 402 cut into rectangular conductive pad 300 is visible in FIG. 4. Recessed area 402 may be formed during the machining process if the tooling used to selectively remove encapsulant from pads 300 has a rotating bit, and if the bit is permitted to continue drilling slightly below the surface of pad 300. According to the example shown, recessed area 402 overlaps conductive pad 300, but does not overlap dividing pedestal 308, indicating that either the size of the routing bit may be changed during the milling process, or the lateral position of the routing bit may be shifted relative to the workpiece during the milling process. One way of automating this shift is to mount the circuit board being processed on a moveable stage so that the workpiece may be positioned as desired, while the milling machine supporting the routing bit remains stationary. Stage movements may be computer-controlled, allowing them to be programmed to achieve repeatability and to yield a consistent product.

Milling features such as recessed area 402 into encapsulating layer 202 is made possible by the integrated approach to the manufacturing process as described herein, with reference to FIGS. 5-7. A series of snapshots 500 shown in FIG. 5 illustrate steps in an exemplary process sequence that incorporates machining operations together with electronics assembly operations to form a pair of integrated interconnect tabs 206 comprising individual integrated tabs 300. Each cross-section panel shown in FIG. 5 corresponds to a manufacturing step in flow diagram 600 presented in FIG. 6.

Attachment step 602 entails placing large, pre-formed, electrically conductive (e.g., metal) pads 300 onto substrate 104 simultaneously with electrical components such as integrated circuit chips (e.g., microprocessors, microcontrollers, digital memory) or discrete electrical components (resistors, capacitors, diodes, and the like) during a surface-mount procedure. Note that conductive pad 300 may experience a slightly shifted x-y (horizontal) placement 502 with respect to an underlying adhesive or similar type of attachment material 503. Attachment materials 503 may include, for example, solder paste that is screen printed onto the PCB. Variation in the volume of solder paste deposited may cause conductive pads 300 to float while the solder paste is molten. Similarly, conductive pad 300 may experience a slightly skewed angular placement 504 with respect to material 503, resulting in a slightly tilted vertical position indicated by comparison with a dotted horizontal "plumb" line 505.

Deposition step 604 entails overmolding PCB assembly 100 and conductive pads 300, a tilted pad on the left, and a shifted pad on the right, with the insulating encapsulating layer 202. According to a preferred method, encapsulation may be accomplished using a dam-and-fill process in which a rectangular form or "dam" is positioned around the perimeter of PCB 100, for containing a liquid or gel-like encapsulant. The dam may be made from, for example, the same G10/FR4 composite material used to fabricate rigid PCBs. Encapsulating layer 202 is formed by dispensing a measured volume of encapsulant and allowing it to spread out over the surface of substrate 104, thereby covering and filling the spaces between surface mounted components 102. The encapsulant then solidifies and undergoes an elevated temperature curing step forming encapsulating layer 202. The dam typically remains in place as part of the final assembly.

Selective removal step 606 entails exposing conductive pad 300, forming curved vertical sidewall portions 310, and optionally forming recessed area 402. According to a preferred method, removal step 606 includes an aligned machining operation such as a milling or routing operation. As shown in FIG. 5, a routing bit 506 rotates around a stationary vertical axis 508 while the encapsulated SMT PCB 200 moves at a first speed, in a horizontal plane perpendicular to vertical axis 508, until it encounters routing bit 506, at which time PCB 200 may continue to move horizontally at a second, slower speed to allow better control of the milling process. According to an embodiment of the method, routing bit 506 removes material from encapsulating layer 202 above pad 300, from the edge of PCB 200 to a point beyond the inside edge 304 of conductive pad 300. As routing bit 506 encounters pad 300, the top surface of pad 300 becomes planarized.

Routing bit 506 may then descend vertically along axis 508, extending downward below the upper surface of pad 300, so that the substantially cylindrical cavity thus formed over conductive pad 300 penetrates pad 300 to ensure complete removal of encapsulant surrounding a tilted or shifted pad 300. A cross-sectional view of the final structure 700 of an exemplary pair of finished tabs 206 is shown in FIG. 7, which illustrates how the structural and electrical integrity of pads 300 may be maintained despite errors in originally placing conductive pads 300. Specifically, final structure 700 exhibits a planar upper surface 510, a cavity 710, and an optional recessed area 402 for both a tilted pad (left) and a shifted pad (right).

Figure 8:
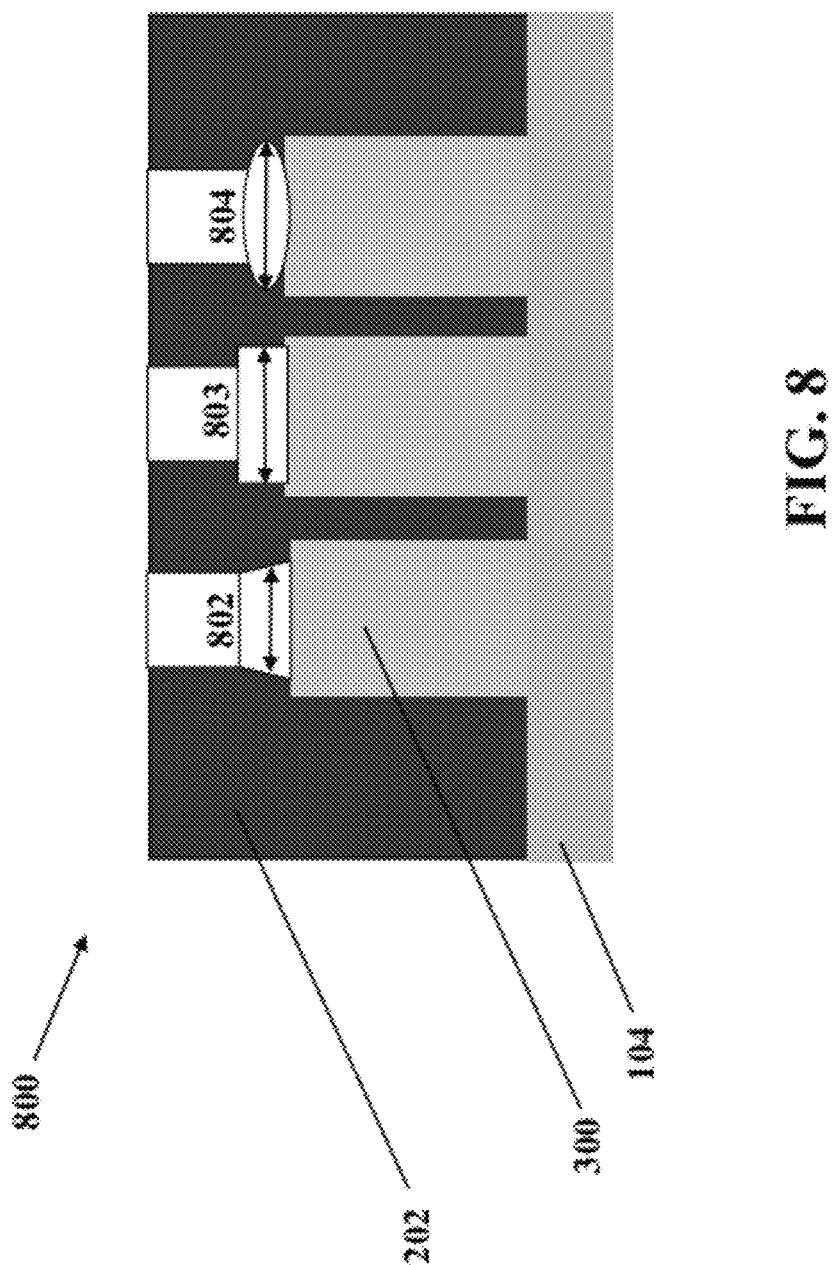
FIG. 8 is a cross-sectional view of an integrated overmolded interconnect tab that includes a retention feature. Three alternative retention feature profiles are indicated.

If, during the machining process, the sidewalls of the encapsulant 202 are expanded at the base, a pocket may be formed that can assist in securely retaining a connector at the top surface of pad 300. With reference to FIG. 8, an alternative embodiment 800 for the sidewall profile formed in encapsulating layer 202 directly above interconnect tabs 203 comprises at least one such retention feature in the form of, for example, a flared vertical sidewall portion 802, a rectangular slot profile 803, or an oval slot profile 804 into which a connector may subsequently be slid laterally, the slot thereby effectively locking the connector into place.

Figure 9:
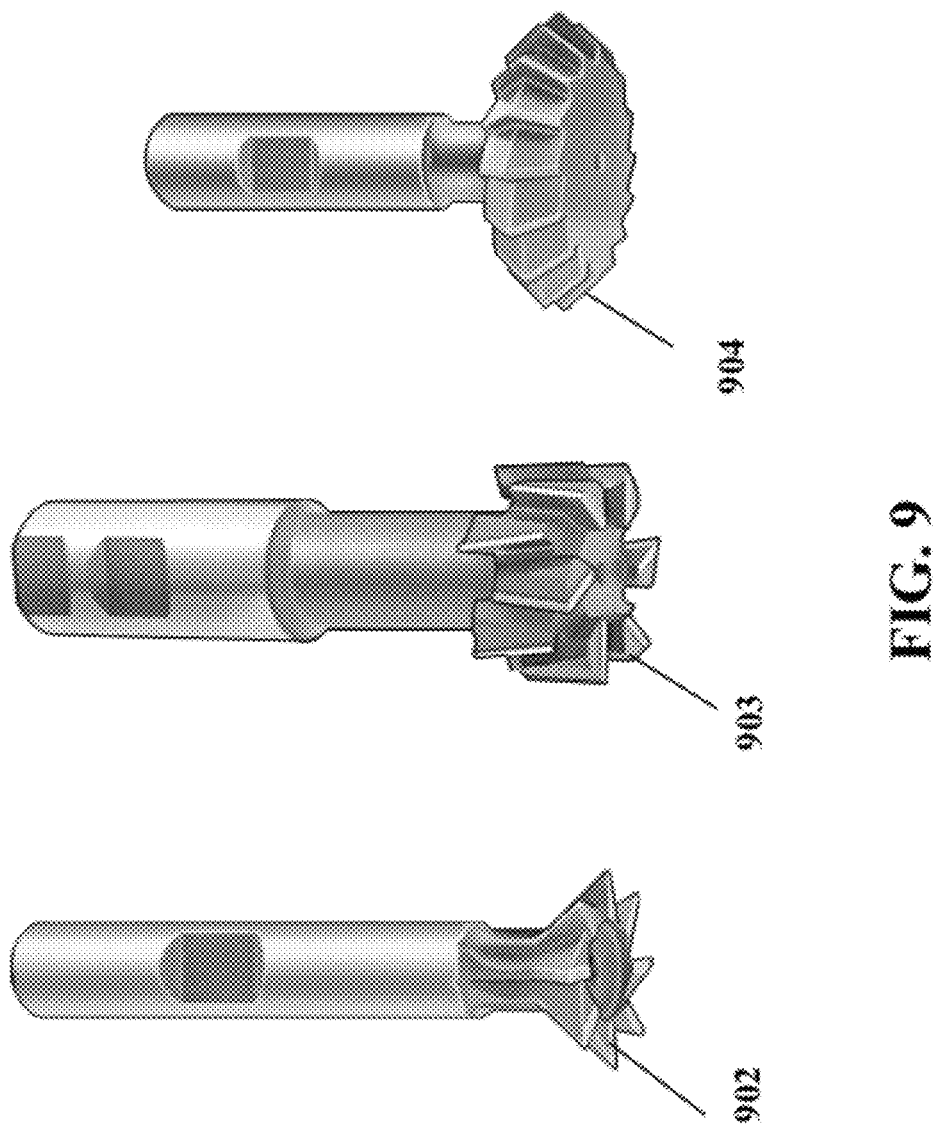
FIG. 9 is a series of three perspective views of routing bits that may be used to create the retention feature profiles shown in FIG. 8.

If such a retention feature is desired, a different routing bit may be substituted for bit 506 to complete the machining operation by expanding either the a) lower portion of cavity 710 above conducting pad 300, or b) the recessed area 402 below the surface of conductive pad 300. FIG. 9 shows examples of different routing bits 900 that are custom-shaped to form the sidewall profiles having retention features shown in FIG. 8. For example, a routing bit having a flared shape 902 may be used to create flared vertical sidewall portion 802; a routing bit having straight vertically-oriented cutting surfaces 903 may be used to create rectangular slot 803; and an oval routing bit 904 may be used to create oval slot 804. Alternatively, creating retention features 802-804 may be accomplished in similar fashion to the method described above for creating recessed area 402 in that a moveable stage may be used to vary the relative positions of the workpiece and the routing bit to create the desired sidewall profile.

Although certain embodiments have been illustrated and described herein, it will be appreciated by those of ordinary skill in the art that a wide variety of alternative or equivalent embodiments or implementations calculated to achieve the same purposes may be substituted for the embodiments illustrated and described without departing from the scope of the invention. Those with skill in the art will readily appreciate that embodiments in accordance with the embodiments of the invention may be implemented in a very wide variety of ways. This application is intended to cover any adaptations or variations of the embodiments discussed herein.

The terms and expressions which have been employed in the foregoing specification are used therein as terms of description and not of limitation, and there is no intention, in the use of such terms and expressions, to exclude equivalents of the features shown and described or portions thereof, it being recognized that the scope of the invention is defined and limited only by the claims that follow.

It will be apparent to those skilled in the art that numerous modifications and variations of the described examples and embodiments are possible in light of the above teaching. The disclosed examples and embodiments are presented for purposes of illustration only. Therefore, it is the intent to cover all such modifications and alternate embodiments as may come within the true scope of this invention.

What is claimed is:

1. An integrated interconnect tab configured to provide a mechanically reparable connection point to make electrical connections to components that are mounted on a printed circuit board comprising: a primed circuit board including an encapsulating insulating layer; an electrically conductive pad coupled with said printed circuit board; wherein said electrically conductive pad comprises an outside edge, an inside edge, a first side edge and a second side edge; wherein said first side edge and said second side edge are parallel side edges; and, a sidewall structure that insulates components from the electrically conductive pad, wherein the sidewall structure is configured to guide and position an interconnecting device used to establish an electrical connection to the electrically conductive pad; wherein said encapsulating insulating layer comprises a curved vertical sidewall portion; wherein the sidewall structure includes a pedestal; and, wherein said pedestal extends alongside said first side edge, beyond said inside edge and terminates before said curved vertical sidewall portion, wherein said curved vertical sidewall portion arches away from said inside edge of said electrically conductive pad, wherein said pedestal comprises a divider termination point located beyond said inside edge and before said curved vertical sidewall portion, such that said pedestal terminates at said divider termination point.

2. The interconnect tab of claim 1, wherein the electrically conductive pad is substantially planar and/or the sidewall structure has a substantially vertical profile.

3. The interconnect tab of claim 1, wherein the printed circuit board comprises an insulating layer that is overmolded or an encapsulating layer comprising epoxy or a laminate.

4. The interconnect tab of claim 3, wherein the insulating layer that is overmolded is substantially conformal.

5. The interconnect tab of claim 1, wherein the interconnecting device comprises one or more wires.

6. The interconnect tab of claim 1, wherein the interconnecting device is an electrical component.

7. The interconnect tab of claim 1, wherein the electrical connection comprises a weld.

8. The interconnect tab of claim 1, wherein the electrically conductive pad comprises a surface configured to be welded.

9. The interconnect tab of claim 8, wherein the surface configured to be welded is configured to accommodate electrical connections to high-voltage electrical components.

10. The interconnect tab of claim 1, wherein the sidewall structure has a profile that includes a retention feature configured to securely retain a connector.

11. The interconnect tab of claim 10, wherein the profile comprises a flare or rectangular or oval.

12. The interconnect tab of claim 10, wherein the retention feature comprises a slot.

* * * * *